(12) United States Patent
Boeuf

(10) Patent No.: US 7,579,254 B2
(45) Date of Patent: Aug. 25, 2009

(54) PROCESS FOR REALIZING AN INTEGRATED ELECTRONIC CIRCUIT WITH TWO ACTIVE LAYER PORTIONS HAVING DIFFERENT CRYSTAL ORIENTATIONS

(75) Inventor: Frederic Boeuf, Le Versoud (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 12/104,882

(22) Filed: Apr. 17, 2008

(65) Prior Publication Data

US 2008/0258254 A1  Oct. 23, 2008

(30) Foreign Application Priority Data

Apr. 20, 2007 (FR) .................................. 07 02873

(51) Int. Cl.
 *H01L 21/76* (2006.01)
(52) U.S. Cl. ...................... 438/405; 257/347; 257/351; 257/E21.571
(58) Field of Classification Search ................ 438/405; 257/347, 351, E21.571
See application file for complete search history.

(56) References Cited

U.S. PATENT DOCUMENTS

| | | | |
|---|---|---|---|
| 6,830,962 B1 | 12/2004 | Guarini et al. | 438/149 |
| 2005/0116290 A1 | 6/2005 | de Souza et al. | 257/347 |
| 2005/0202600 A1 | 9/2005 | Yamashita | 438/149 |
| 2005/0236687 A1 | 10/2005 | Chan et al. | 257/482 |
| 2005/0275018 A1* | 12/2005 | Venkatesan et al. | 257/347 |
| 2006/0017137 A1* | 1/2006 | Iwamatsu | 257/627 |
| 2006/0024931 A1 | 2/2006 | Chan et al. | 438/528 |
| 2006/0091427 A1 | 5/2006 | Waite et al. | 257/213 |
| 2006/0094169 A1 | 5/2006 | White et al. | 438/149 |
| 2006/0125013 A1* | 6/2006 | Rim | 257/351 |
| 2006/0145264 A1 | 7/2006 | Chidambarrao et al. | 257/369 |
| 2006/0292770 A1 | 12/2006 | Wu et al. | 438/187 |
| 2008/0283958 A1* | 11/2008 | Ohnuma | 257/506 |
| 2008/0303090 A1* | 12/2008 | Ieong et al. | 257/351 |

* cited by examiner

*Primary Examiner*—Trung Dang
(74) *Attorney, Agent, or Firm*—Lisa K. Jorgenson; Robert Iannucci; Seed IP Law Group PLLC

(57) ABSTRACT

A process for realizing an integrated electronic circuit makes it possible to obtain transistors with p-type conduction and transistors with n-type conduction, in respective active zones having crystal orientations adapted to each conduction type. In addition, each active zone is electrically insulated from a primary substrate of the circuit, so that the entire circuit is compatible with SOI technology.

25 Claims, 3 Drawing Sheets

PROCESS FOR REALIZING AN INTEGRATED ELECTRONIC CIRCUIT WITH TWO ACTIVE LAYER PORTIONS HAVING DIFFERENT CRYSTAL ORIENTATIONS

BACKGROUND

1. Technical Field

This invention relates to a process for realizing an integrated electronic circuit comprising two active layer portions with different crystal orientations. Such a circuit can be CMOS, or "Complementary Metal-Oxide-Semiconductor" in the terminology of a person skilled in the art. It also relates to an integrated electronic circuit of the type obtained by such a process.

2. Description of the Related Art

CMOS integrated electronic circuits contain MOS transistors with n-type conduction (nMOS) and MOS transistors with p-type conduction (pMOS).

The channel of a MOS transistor commonly has a monocrystalline portion based on silicon, to reduce the electrical resistance of the transistor in the on state. "Monocrystalline portion" is understood to mean a portion of crystalline material in which the crystal orientation does not substantially vary across this portion, in spite of the presence of any defects. Such defects may be dislocations or isolated defects for example.

It is also known that the electrical resistance of a MOS transistor channel depends on the crystal orientation of this channel. For a transistor which is intended to carry an electrical current by n-type carriers, the crystal orientation of the channel is preferably the crystallographic direction (1 0 0) of the silicon material, with a longitudinal conduction direction of the channel which additionally corresponds to a crystallographic direction (1 1 0) of the silicon. The crystallographic direction of the material is identified in the manner commonly used in crystallography, and two crystallographic directions are considered to be equivalent when they are associated by a symmetry operation of the crystal lattice. The crystal orientation of a portion of material in an integrated electronic circuit is defined by the crystallographic direction of this material which is perpendicular to the surface of the circuit substrate.

In a transistor which is intended to conduct an electrical current by p-type carriers, the crystal orientation of the channel which corresponds to a minimal electrical resistance is the crystallographic direction (1 1 0) of the silicon, with the longitudinal conduction direction of the channel parallel to a crystallographic direction (1 1 0) of the silicon again. In particular, the electrical resistance of the channel of a p-type conduction transistor can decrease by a factor of three when the crystal orientation of the channel is changed from (1 0 0), as in an n-type conduction transistor, to (1 1 0).

It is therefore particularly advantageous to realize the channels of nMOS and PMOS transistors of a CMOS circuit in different active layer portions which have the preferred crystal orientations for each type of transistor. To achieve this, various processes for realizing a CMOS circuit have been proposed, for combining monocrystalline active zones which have different orientations within the same circuit.

An "active zone" of an integrated electronic circuit is understood to mean a part of the circuit in which at least one transistor channel is realized or intended to be realized. In the text below, the material of an active zone is semiconducting and monocrystalline, silicon-based, and is doped in order to possess the appropriate electrical conduction.

In a first known process, a film based on monocrystalline silicon of orientation (1 1 0) is assembled with a silicon substrate of orientation (1 0 0). It is assembled by direct molecular bonding of the film's silicon material to the material of the substrate. Next the film material is rendered amorphous, then recrystallized in certain zones. The obtained recrystallization corresponds to the crystal orientation of the substrate. In this manner, active zones are available on the substrate which have the preferred crystal orientations for realizing pMOS and nMOS transistors. But these correspond to the bulk technology for realizing transistors, in which the transistors are isolated from the substrate by doping wells.

A second known process uses an SOI, for Silicon on Insulator, substrate. Such a substrate comprises a primary substrate based on monocrystalline silicon, an electrically insulating layer which is initially placed on a surface of the primary substrate, and an active layer based on monocrystalline silicon which is initially placed on the insulating layer. The primary substrate and the initial active layer have crystal orientations which respectively correspond to the crystallographic directions (1 0 0) and (1 1 0) of the silicon. The initial and insulating active layers are then selectively etched in a second zone of the substrate relative to a first zone of the substrate, so as to expose a surface of the primary substrate in the second zone. An insulating spacer is thus formed on the sides of the initial and insulating active layers between the first and second zones, then a portion of silicon is formed in the second zone by epitaxial growth, starting from the exposed surface of the primary substrate. In this way, active layer portions are obtained in the first and second zones which have the crystal orientations (1 1 0) and (1 0 0). They are therefore respectively adapted for realizing transistors with p-type and n-type conduction in these zones. The transistors in the first zone then correspond to the SOI technology, while those in the second zone correspond to the bulk technology. The integrated electronic circuit which is obtained is therefore a hybrid, making its design and fabrication more costly and difficult.

A third known process uses a dual-SOI substrate, with two superimposed active layers which are separated from the primary substrate by a first electrically insulating layer, and which are separated from each other by a second insulating layer. Each active layer is exposed in a different zone of the substrate, and has the crystal orientation adapted for one of the two types of transistors, p-type or n-type. But the dual-SOI substrate which is used is particularly costly because of its complexity.

BRIEF SUMMARY

One object of the invention is therefore to realize in an economic manner an electronic circuit chip which comprises both n-type and p-type conduction transistors, which corresponds to the SOI technology, and for which the electrical resistances in the on state are reduced.

To this end, the invention proposes a process for realizing an integrated electronic circuit, which comprises the following steps:

/1/ obtaining a substrate with an initial insulating layer, which substrate comprises:

a primary substrate based on monocrystalline silicon, the initial electrically insulating layer, which is placed on a surface of the primary substrate, and an initial active layer based on monocrystalline silicon, which is placed on the initial insulating layer on a side opposite the primary substrate, with the primary substrate and the initial active layer having different respective crystal orientations relative to the surface of the primary substrate, /2/ selectively etching the initial active and insulating layers, in a second zone of the substrate relative to a first zone of the substrate, so as to expose a surface of the primary substrate within the second zone, /3/ selectively forming by epitaxy in the second zone, starting from the exposed surface of the primary substrate, a stack which comprises a portion of temporary monocrystalline layer and a portion of additional active monocrystalline layer, with the additional active layer portion being located on a side of the temporary layer portion opposite the primary substrate and having the crystal orientation of the primary substrate, /4/ forming a supporting portion on the circuit, which is rigidly connected to the additional active layer portion, and to the primary substrate independently of the temporary layer portion, /5/ selectively etching the temporary layer portion, with the additional active layer portion being held in place by the supporting portion, and /6/ forming a portion of additional electrically insulating layer in place of the temporary layer portion.

The process further comprises a realization of at least a first and at least a second transistor, in the first and second zones of the substrate respectively, with the first transistor having a first channel located in the initial active layer and the second transistor having a second channel located in the additional active layer portion.

An integrated electronic circuit realized according to the invention therefore comprises transistors for which the channels have different respective crystal orientations. These orientations can then be separately adapted to the structural characteristics, the types of electrical conduction, or the different uses of the transistors in the two zones.

In addition, the transistors in the two zones of the circuit correspond to SOI technology, as their respective channels are separated from the primary substrate either by the initial insulating layer, or by the additional insulating layer portion. All the transistors therefore have consistent electrical properties, which simplifies the design and implementation of the circuit as a whole.

However, one advantage of a process of the invention arises from its compatibility with the use of an SOI substrate with a single active layer. Such a substrate is available commercially for a moderate price.

Advantageously, the supporting portion which is formed in step /4/ may comprise a part of a gate of the second transistor.

In one possible embodiment of the invention, the crystal orientation of the primary substrate can be a crystallographic direction (1 0 0) of silicon, or a direction equivalent to this, and the crystal orientation of initial active layer can be a crystallographic direction (1 1 0) of silicon, or a direction equivalent to this. The first and second transistors are then respectively adapted to conduct p-type and n-type electrical carriers in the corresponding channels. The circuit is then a complementary transistor circuit. When these transistors have a MOS structure, the circuit is then a CMOS circuit using SOI technology. It is therefore particularly suitable for logic functions at high operating speeds.

In an alternative embodiment of the invention, the crystal orientation of the primary substrate may be a crystallographic direction (1 1 0) of silicon, or a direction equivalent to this, and the crystal orientation of the initial active layer can be a crystallographic direction (1 0 0) of silicon, or a direction equivalent to this. The first and second transistors are then respectively adapted to conduct n-type and p-type electrical carriers in the corresponding channels.

Advantageously, in each of the two cases above, the longitudinal conduction direction of at least one of the channels in the first or second transistor, and preferably each of their channels, parallel to the surface of the substrate, is or is equivalent to a crystallographic direction (1 1 0) of the silicon.

The invention additionally proposes an integrated electronic circuit comprising:

a primary substrate based on monocrystalline silicon, first and second portions of insulating layers, which are arranged on a surface of the primary substrate in separate respective zones of said substrate, first and second portions of monocrystalline active layers, which are respectively arranged on top of the first and second portions of insulating layers on a side opposite the primary substrate, at least a first transistor which is adapted to produce electrical conduction by p-type carriers in a first channel situated in the first active layer portion, and at least a second transistor which is adapted to produce electrical conduction by n-type carriers in a second channel situated in the second active layer portion.

Crystal orientations of the first and second active layer portions are different relative to the surface of the primary substrate, and the primary substrate additionally has a crystal orientation which is identical to that of one of these first and second active layer portions. In addition, separations between the primary substrate and each of the first and second active layer portions respectively comprise the first and second insulating layer portions as a single independent insulating portion within each of these separations. In the invention, "independent insulating portion" is understood to mean an insulating portion which is separated from another insulating portion by an intermediate conducting or semiconducting portion.

In particular, such a circuit can be obtained by a process as described above.

It may further comprise an electrically insulating barrier which is situated between the zones of the primary substrate. Such a barrier can, in particular, insulate from each other the respective active layer portions in the two zones.

The invention also proposes an electrical device which comprises such an integrated electronic circuit. Such a device may be, but is not limited to, a wireless telephone, a computer, a television set, a server, a router, a gaming console, etc., depending on the function of the integrated electronic circuit.

BRIEF DESCRIPTION OF THE SEVERAL VIEWS OF THE DRAWINGS

Other features and advantages of the invention will become clear in the description below of an example of a non-limiting implementation, referring to the attached drawings where.

DETAILED DESCRIPTION

For clarity, the sizes of the various elements represented in these figures do not correspond to the actual sizes or size ratios. In addition, the same references appearing in different figures indicate the same elements. FIGS. 1-4 and 11 are sectional views of an integrated electronic circuit during its fabrication, and FIGS. 5-10 are perspective views of the same circuit at different steps in the process. The substrate of the circuit is found in the lower part of all figures, and N indicates a direction perpendicular to a flat surface S0 of the substrate, pointing towards the top of the figures. The words "on", "under", "above", and "below" used below are in reference to this orientation.

Now a process will be described for realizing the circuit of the invention, citing the steps for doing so in one possible order. Each of the steps is not described in detail regarding its implementation parameters, as such information is known to a person skilled in the art.

Figure 1:
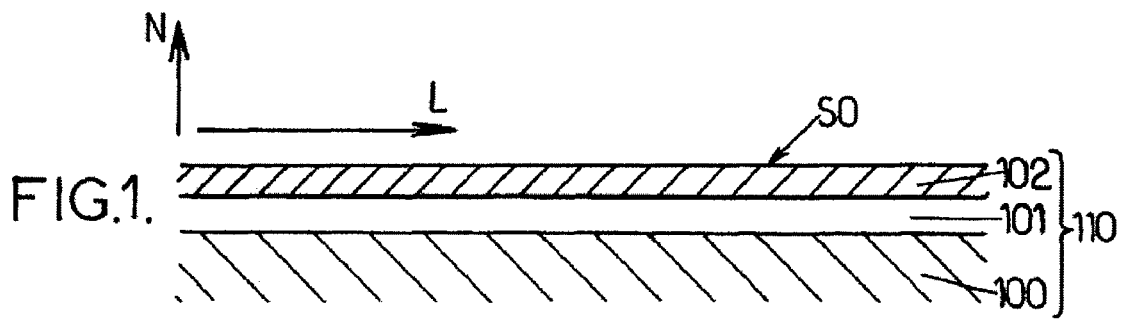
FIGS. 1 to 11 illustrate different steps of a process for realizing an integrated electronic circuit of the invention.

As shown in FIG. 1, an SOI substrate 110 comprises a primary substrate 100, an electrically insulating layer 101, and an active layer 102. Such a substrate 110 is commercially available from SOITEC® for example. S0 indicates the upper surface of the layer 102, which corresponds to that of the substrate 110. It is generally flat. The primary substrate 100 is of monocrystalline silicon (Si-mono) and has for example a crystal orientation (1 0 0) relative to the surface S0. In other words, the crystallographic direction (1 0 0) of the silicon material of the substrate 100 is parallel to the direction N. The layer 101 may be of silica ($SiO_2$) and have a thickness of 30 to 50 nm (nanometers) in direction N. It is called the initial insulating layer. The active layer 102 is also of monocrystalline silicon (Si-mono), but has a crystal orientation (1 1 0). In other words, the crystallographic direction (1 1 0) of the silicon material of the layer 102 is parallel to the direction N. The layer 102 may also have a thickness of 30 to 50 nm and is called the initial active layer. The layer 102 may possibly be n-doped.

The SOI substrate is also prepared such that the primary substrate 100 and the initial active layer 102 both have a crystallographic direction (1 1 0) which is parallel to the surface S0. In the figures, L indicates a direction (1 1 0) common to the initial active layer 102 and the primary substrate 100. In other embodiments of the invention, it may be preferable to have crystallographic directions (1 1 0) of the initial active layer 102 and the primary substrate 100 which are different, perpendicular for example, in particular in order to adjust stresses present in the circuit and/or to allow for the longitudinal conduction directions of nMOS and pMOS transistors, which are different.

Figure 2:
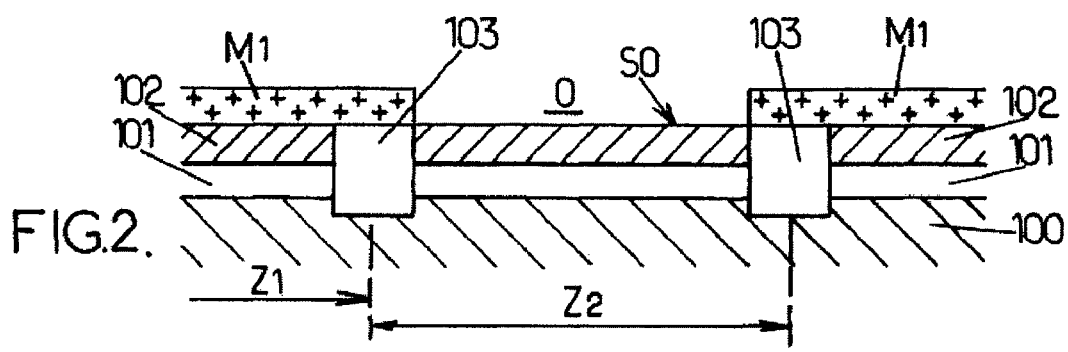

Then an electrically insulating barrier 103 is formed in the substrate 110, extending from the surface S0 at least to the layer 101 in the direction N (FIG. 2). The barrier 103 separates a first and a second zone of the substrate 110, respectively labeled Z1 and Z2. Preferably, the barrier 103 surrounds the zone Z2, and possibly the zone Z1 as well. It may be one of the types of insulating barriers known to a person skilled in the art, for example LOCOS (Local Oxidation of Silicon) or STI (Shallow Trench Isolation). It is then of silica ($SiO_2$).

A first etch mask, labeled M1, is then selectively formed on the circuit in the zone Z1. Such a mask may be defined by photolithography, and may be of resin or silicon nitride ($Si_3N_4$) for example. The mask M1 has an opening O which substantially corresponds to the zone Z2.

Figure 3:
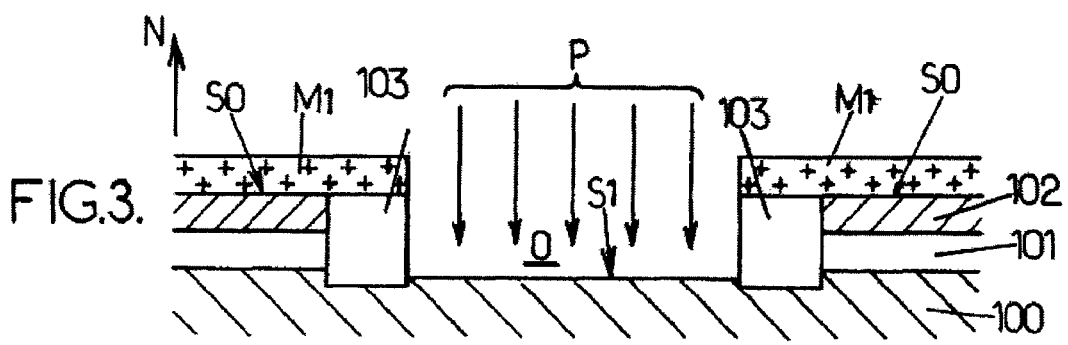

Next the layers 102 then 101 are selectively etched in zone Z2 of the circuit, through the opening O of the mask M1. To this purpose, a plasma P of etching particles may be accelerated parallel to direction N, in the reverse direction from N, and directed towards at the upper surface S0 (FIG. 3). The layers 102 then 101 are thus successively etched, with a horizontal and descending etch front. The etching is stopped when this front penetrates the primary substrate 100. The substrate 100 is thus exposed in the zone Z2, at the exposure surface S1.

Figure 4:
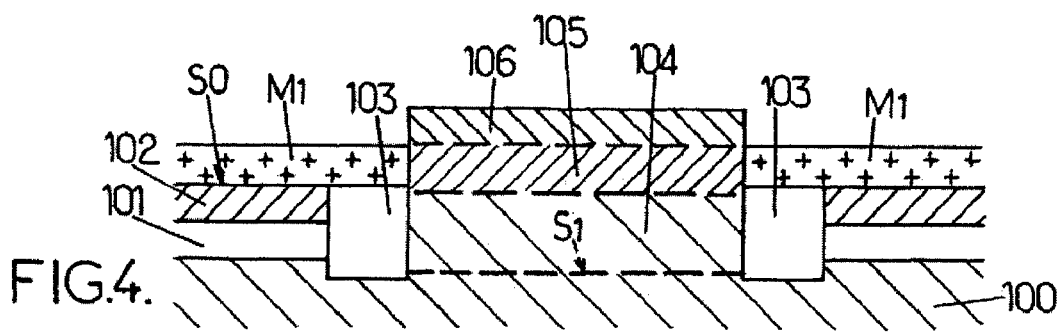

Next are formed by epitaxial growth in the zone Z2, a silicon-based lower layer portion 104, a temporary layer portion 105, then an additional active layer portion 106 (FIG. 4). The portions 104, 105 and 106 are therefore monocrystalline and are superimposed in the form of a stack on the surface S1.

The portion 104, which is located between the primary substrate 100 and the portion 105, is not indispensable to the invention. It allows easily ensuring that the portion 105 is at least partially above the level of the initial surface S0, which substantially corresponds to the level of the upper surface of the barrier 103.

The temporary layer portion 105 may comprise an alloy of silicon (Si) and germanium (Ge), with a proportion of germanium atoms which can be comprised between 20% and 50%. Such alloy crystallizes in a known manner similar to pure silicon. Alternately, the portion 105 can be a monocrystalline alloy of silicon (Si) and boron (B). The proportions of the various atoms in each alloy usable for the portion 105 are determined so as not to modify the crystallization of the portion relative to that of pure silicon, while allowing a selective etching of the portion relative to pure silicon or silicon which has been doped to provide it with the appropriate conduction.

The additional active layer portion 106 may be of pure or doped silicon, for example p-type. It has the same crystal orientation as the primary substrate 100.

The portions 105 and 106 may have thicknesses similar to those of the initial layers 101 and 102.

Figure 5:
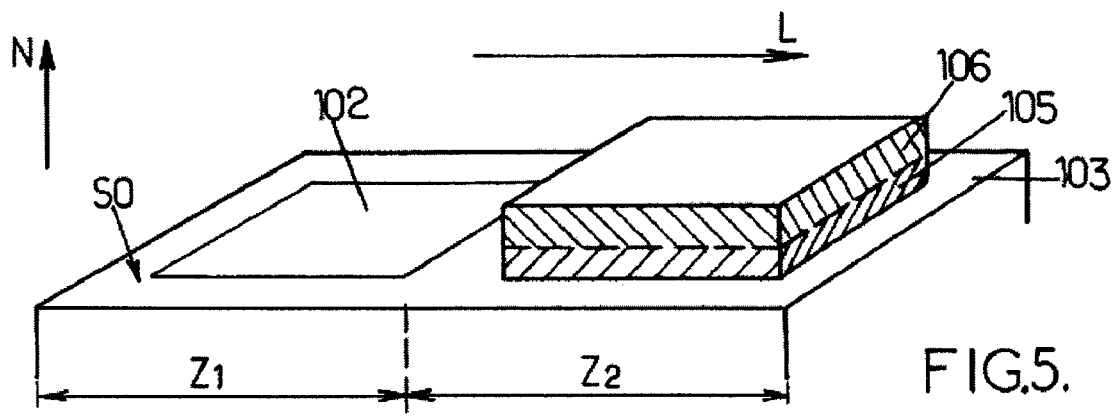
Figure 6:
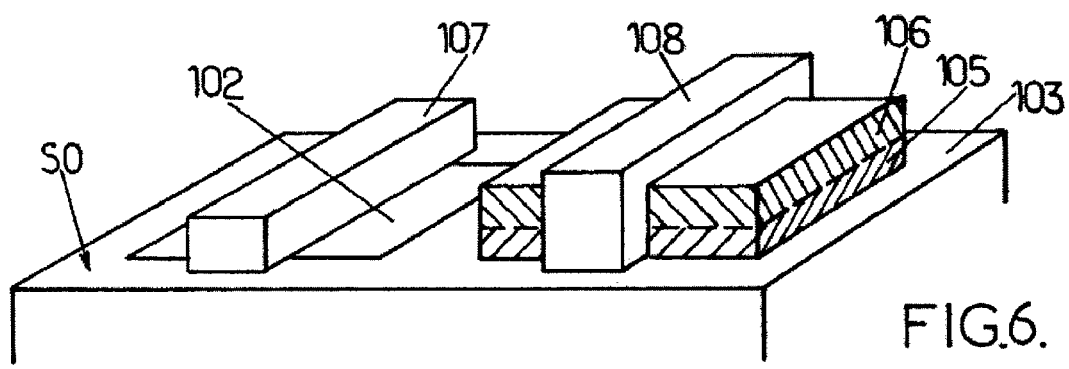

FIG. 5 represents the circuit of FIG. 4 in a perspective view, after removal of the mask M1.

In one embodiment, the layer portion 106 will be maintained in place on the substrate, during a later step in the process, by a supporting portion which is also intended to form a gate of a transistor in the zone Z2. In this case, an insulating layer may be formed now on the additional active layer portion 106, so as to electrically isolate this portion 106 of the gate of the final transistor. This insulating layer, which is not represented in the figures, may be formed by thermal oxidation of the silicon material already present in the circuit, in the exposed zones of the circuit, in the same manner as in the usual process for fabricating a MOS transistor. It is then formed on the surface of the portion 106, on the surface of the initial active layer portion 102, and on the exposed lateral sides of the portion 105.

Next is formed the supporting portion 108 (FIG. 6), in the form of a bridge having end support portions supported by the insulating barrier 103 on each side of the portion 106, out from the portions 105 and 106. The central part of the portion 108 is solidly attached to top of the additional active layer portion 106. The supporting portion 108 is preferably of polycrystalline silicon (Si-poly). It can be realized in the same manner as a gate portion 107 in the zone Z1, according to the usual MOS process. In this case, the portions 107 and 108 are advantageously formed simultaneously, on the initial active layer portion 102 in the zone Z1 and on the additional active layer portion 106 in the zone Z2 respectively, using the same lithography mask.

Then at least a part of the temporary layer portion 105 is exposed. To this purpose, when the portion 105 is at least partially located above the level of the initial surface S0, the gate insulating layer may be removed by chemical etching, out from the parts of this insulating layer which are covered by the portions 107 and 108. A solution containing hydrofluoric acid (HF) can be used for this etching, selectively dissolving the gate insulating layer relative to the silicon material and the silicon-germanium alloy, and without substantially altering the barrier 103 which is thick. In the zone Z2 of the circuit, the lateral sides of the portion 105 are thus exposed. Alternatively, particularly when the portion 105 is completely located below the level of the initial surface S0, a chimney may be etched through the layer 106, parallel to and in the opposite direction from the direction N, and apart from the portion 108. A part of the portion 105 is thus exposed at the bottom of the chimney.

Figure 7:
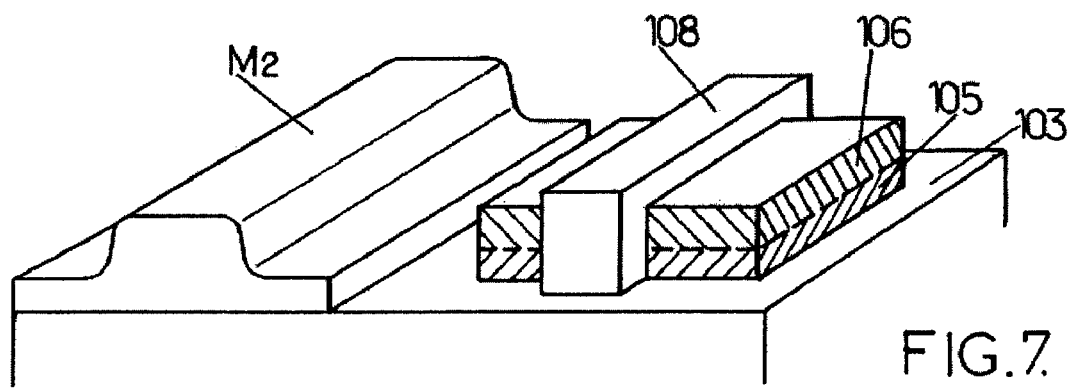

A second etching mask, labeled M2, is then selectively formed on the circuit in the zone Z1 (FIG. 7). This mask M2 is preferably of resin, but it can also be of a material such as an oxide or nitride, for example silica ($SiO_2$) or silicon nitride ($Si_3N_4$).

Figure 8:
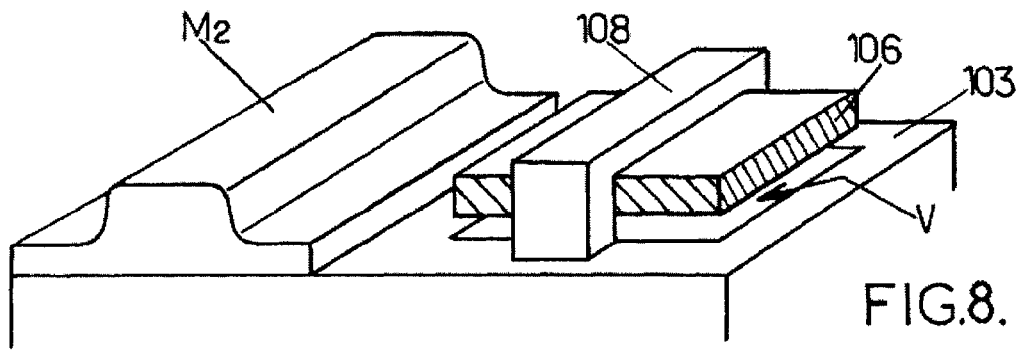

The portion 105 is then completely eliminated, starting from the part of it which is exposed, using a selective etching procedure which is known to a person skilled in the art and is adapted to the temporary material of which it is composed. In particular, such an etching can be achieved using a liquid etchant. The configuration of the circuit which is obtained at the end of this etching step is represented in FIG. 8. The portion 106 is then held in place by the supporting portion 108.

Figure 9:
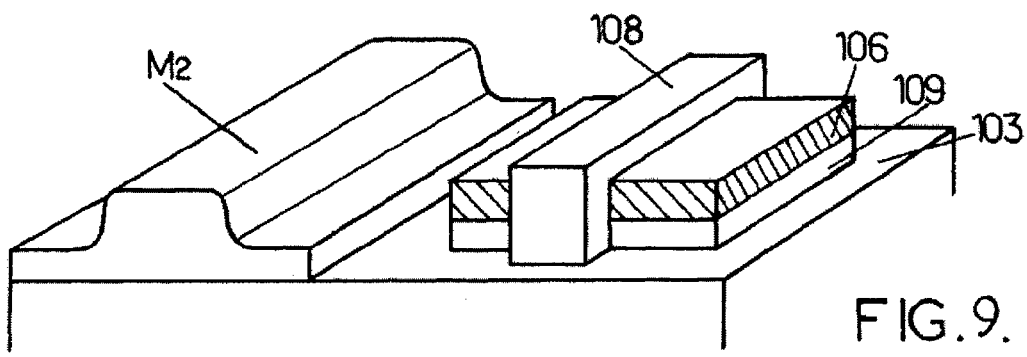

The empty space V which is thus formed between the portion 106 on one hand, and the portion 104 or the primary substrate 100 on the other hand, can then be filled in with a portion 109 of an insulating material (FIG. 9). This insulating material can be silica ($SiO_2$) or silicon nitride ($Si_3N_4$), for example. The portion 109 is preferably formed using low pressure vapor deposition in order to obtain complete filling of the space V under the portion 106. However, complete filling is not indispensable, and partial filling may be sufficient. Any excess of insulating material deposited on the circuit in the zone Z2 can then be removed, for example using an etching plasma which is brought into contact with the upper surface of the circuit.

The mask M2 is then removed, for example by dissolution in an appropriate solution when it is of resin.

Figure 10:
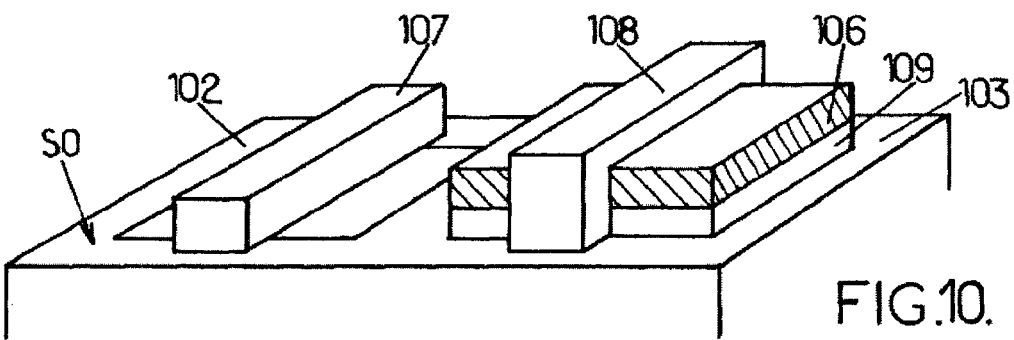

FIG. 10 illustrates the configuration of the circuit which is then obtained. The portions 102 and 106 constitute the first and second active layer portions, each electrically insulated from the primary substrate 100. For this reason, the circuit is of the SOI type in each zone Z1 and Z2. In addition, the portions 102 and 106 are both monocrystalline, with the respective orientations (1 1 0) and (1 0 0) relative to the surface S0. When a portion 104 is present under the portion 105, this latter then at least partially appears above the upper surface of the insulating barrier 103.

Figure 11:
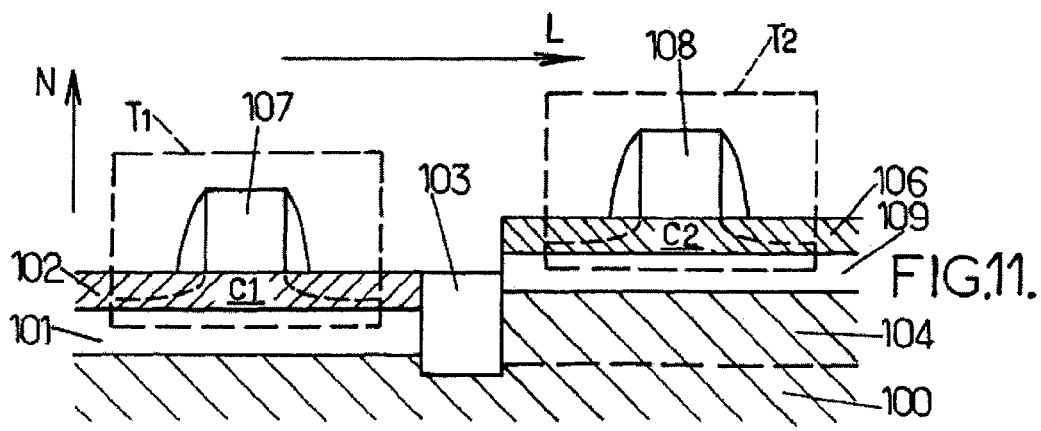

The known process for realizing CMOS transistors can then be used again in order to continue creating the circuit from the configuration in FIG. 10. The portion 107 then constitutes a gate of a p-type MOS transistor which is realized in the zone Z1 from the active layer portion 102. The portion 108 constitutes a gate of an n-type MOS transistor which is realized in the zone Z2 from the active layer portion 106. In a known MOS process, spacers of silicon nitride are formed around gate portions 107 and 108, and then the active zone portions 102 and 106 are each implanted to form the source and drain zones. Lastly, the portions 102 and 106-108 are converted into silicide material on their exposed upper surfaces, in order to receive electrical connections. FIG. 11 represents a sectional view of the circuit which is obtained. T1 and T2 indicate the transistors which are formed in the zones Z1 and Z2 respectively.

The transistors T1 and T2 have respective channels labeled C1 and C2, which are respectively n- and p-doped when the doping indicated above is performed. For the electrical resistances of these channels to be reduced in accordance with the crystal orientations of the active layer portions 102 and 106, the transistors T1 and T2 are used in the population inversion condition. But it is understood that such condition is not indispensable. When it is not applied, the n- and p-doping of the initial active layer 102 and the additional active layer portion 106 are exchanged. In addition, the longitudinal conduction direction of channels C1 and C2 is the direction L.

The two transistors T1 and T2 respectively realized in the zones Z1 and Z2 of the circuit are separated by the insulating barrier 103. In one embodiment, this barrier was realized before etching the layers 102 and 101 in the zone Z2. In this manner, the mask M1 can have an edge at the barrier 103, without this edge being precisely positioned relative to the thickness of the barrier 103. This can save time during alignment of the lithography mask defining the mask M1. The barrier 103 can also be realized later, however, before the supporting portion 108 is formed.

It is understood that the initial SOI-type substrate used to realize the CMOS circuit can alternatively comprise a primary substrate 100 which has the crystal orientation (1 1 0) and an initial active layer which has the crystal orientation (1 0 0). The positions of the n- and p-type transistors are then exchanged relative to the zone of the circuit in which the temporary layer portion is formed and then replaced.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for realizing an integrated electronic circuit, comprising:
   obtaining an SOI substrate, said SOI substrate including:
      a primary substrate based on monocrystalline silicon,
      an initial insulating layer on a surface of the primary substrate, and
      an initial active layer based on monocrystalline silicon, on the initial insulating layer on a side opposite the primary substrate, with the primary substrate and the initial active layer having different respective crystal orientations relative to the surface of the primary substrate;
   selectively etching the initial active and insulating layers in a second zone of the SOI substrate, relative to a first zone of said SOI substrate, so as to expose a surface of the primary substrate in said second zone;
   selectively forming in the second zone, by epitaxy starting from the exposed surface of the primary substrate, a stack comprising a monocrystalline temporary layer and a monocrystalline additional active layer, with the additional active layer being placed on a side of the temporary layer opposite the primary substrate and having the crystal orientation of said primary substrate;
   forming a supporting portion rigidly connected to the additional active layer, and to the primary substrate independently of the temporary layer;
   selectively etching the temporary layer, with the additional active layer being held in place by the supporting portion;
   forming an additional insulating layer in place of the temporary layer; and
   realizing first and second transistors in the first and second zones of the substrate respectively, with said first transistor having a first channel situated in the initial active layer and said second transistor having a second channel situated in the additional active layer.

2. A process according to claim 1, wherein the supporting portion comprises at least a part of a gate of the second transistor, and wherein said process further comprises:
forming, before forming the supporting layer, an insulating layer on the additional active layer, so as to electrically insulate said additional active layer from the gate of the second transistor; and
exposing, before selectively etching the temporary layer, at least a part of the temporary layer.

3. A process according to claim 1, wherein the crystal orientation of the primary substrate is equivalent to a first crystallographic direction (1 0 0) of silicon, the crystal orientation of the initial active layer is equivalent to a second crystallographic direction (1 1 0) of silicon, and wherein said first and second transistors are respectively structured to conduct p-type and n-type electrical carriers, in the respective channels of said transistors.

4. A process according to claim 3, wherein the channels of said first and second transistors are respectively n- and p-doped.

5. A process according to claim 3, wherein a longitudinal conduction direction of at least one of the channels of the first and second transistors parallel to the surface of the substrate, is equivalent to the second crystallographic direction (1 1 0) of silicon.

6. A process according to claim 1, wherein the crystal orientation of the primary substrate is or is equivalent to a first crystallographic direction (1 1 0) of silicon, the crystal orientation of the initial active layer is equivalent to a second crystallographic direction (1 0 0) of silicon, and wherein said first and second transistors are respectively adapted to conduct n-type and p-type electrical carriers, in the respective channels of said transistors.

7. A process according to claim 1, wherein the temporary layer comprises an alloy of silicon and germanium.

8. A process according to claim 1, wherein selectively forming the stack comprises forming a lower monocrystalline layer based on silicon, situated between the primary substrate and the temporary layer.

9. A process according to claim 1, further comprising:
forming, before forming the supporting portion, an electrically insulating barrier in the SOI substrate, between the first and second zones, and extending from a surface of the initial active layer opposite the primary substrate, at least to the initial insulating layer.

10. A process according to claim 9, wherein the insulating barrier is formed before selectively etching the initial active and insulating layers.

11. A process according to claim 9, wherein the supporting portion is supported by the insulating barrier out from the additional insulating and active layers.

12. An integrated electronic circuit comprising:
a primary substrate based on monocrystalline silicon;
first and second insulating layers placed on a surface of the primary substrate at separate respective zones of said primary substrate;
monocrystalline first and second active layers respectively placed above said first and second insulating layers, the first and second active layers having different crystal orientations relative to the surface of the primary substrate, and the primary substrate having a crystal orientation corresponding to that of one of said first and second active layers;
a first transistor having a first channel situated in said first active layer;
a second transistor having a second channel situated in said second active layer; and
an electrically insulating barrier situated between the zones of the primary substrate, wherein the second insulating layer is positioned at least partially above a top surface of the insulating barrier.

13. A circuit according to claim 12, wherein the crystal orientation of the first active layer is equivalent to a crystallographic direction (1 1 0) of silicon, and the crystal orientation of the second active layer is equivalent to a crystallographic direction (1 0 0) of silicon.

14. A circuit according to claim 13, wherein a longitudinal conduction direction of at least one of the channels of the first and second transistors, parallel to the surface of the primary substrate, is equivalent to a crystallographic direction (1 1 0) of silicon.

15. A circuit according to claim 13, wherein the channels of said first and second transistors are respectively n- and p-doped.

16. A circuit according to claim 12, additionally comprising a monocrystalline layer positioned between the primary substrate and the second insulating layer.

17. A circuit according to claim 12, wherein the second transistor includes a conductive gate having a central portion, positioned on a top side of the second active portion, and end support portions positioned on lateral sides of the second active portion, the end support portions supporting the central portion on the primary substrate.

18. An electrical device comprising:
an integrated electronic circuit that includes:
a primary substrate based on monocrystalline silicon;
first and second insulating layers placed on a surface of the primary substrate at separate respective zones of said primary substrate;
monocrystalline first and second active layers respectively placed above said first and second insulating layers, the first and second active layers having different crystal orientations relative to the surface of the primary substrate, and the primary substrate having a crystal orientation corresponding to that of one of said first and second active layers;
a first transistor having a first channel situated in said first active layer;
a second transistor having a second channel situated in said second active layer; and
an electrically insulating barrier situated between the zones of the primary substrate, wherein the second insulating layer is positioned at least partially above a top surface of the insulating barrier, with said device being one of a portable telephone, a computer, a television set, a server, a router, and a gaming console.

19. A device according to claim 18, wherein the circuit includes a monocrystalline layer positioned between the primary substrate and the second insulating layer.

20. A device according to claim 18, wherein the second transistor includes a conductive gate having a central portion, positioned on a top side of the second active portion, and end support portions positioned on lateral sides of the second active portion, the end support portions supporting the central portion on the primary substrate.

21. An integrated electronic circuit comprising:
a monocrystalline primary substrate;
first and second insulating layers placed on a surface of the primary substrate at separate respective zones of said primary substrate;
monocrystalline first and second active layers respectively placed above said first and second insulating layers, the first and second active layers having different crystal orientations relative to the surface of the primary substrate, and the primary substrate having a crystal orientation corresponding to that of one of said first and second active layers;

a first transistor having a first channel situated in said first active layer; and a second transistor having a second channel situated in said second active layer and a conductive gate having a central portion, positioned on a top side of the second active portion, and end support portions positioned on lateral sides of the second active portion, the end support portions supporting the central portion on the primary substrate.

22. A circuit according to claim 21, wherein the crystal orientation of the first active layer is equivalent to a crystallographic direction (1 1 0) of silicon, and the crystal orientation of the second active layer is equivalent to a crystallographic direction (1 0 0) of silicon.

23. A circuit according to claim 22, wherein a longitudinal conduction direction of at least one of the channels of the first and second transistors, parallel to the surface of the primary substrate, is equivalent to a crystallographic direction (1 1 0) of silicon.

24. A circuit according to claim 21, wherein the channels of said first and second transistors are respectively n- and p-doped.

25. A circuit according to claim 21, additionally comprising a monocrystalline layer positioned between the primary substrate and the first insulating layer.

\* \* \* \* \*